United States Patent
Giannakis et al.

(10) Patent No.: US 7,251,768 B2
(45) Date of Patent: Jul. 31, 2007

(54) WIRELESS COMMUNICATION SYSTEM HAVING ERROR-CONTROL CODER AND LINEAR PRECODER

(75) Inventors: Georgios B. Giannakis, Minnetonka, MN (US); Zhengdao Wang, Ames, IA (US); Shengli Zhou, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 467 days.

(21) Appl. No.: 10/420,361

(22) Filed: Apr. 21, 2003

(65) Prior Publication Data

US 2004/0022179 A1 Feb. 5, 2004

Related U.S. Application Data

(60) Provisional application No. 60/374,886, filed on Apr. 22, 2002, provisional application No. 60/374,935, filed on Apr. 22, 2002, provisional application No. 60/374,934, filed on Apr. 22, 2002, provisional application No. 60/374,981, filed on Apr. 22, 2002, provisional application No. 60/374,933, filed on Apr. 22, 2002.

(51) Int. Cl.
*H03M 13/29* (2006.01)
*H03M 13/45* (2006.01)

(52) U.S. Cl. ............... 714/755; 375/262; 714/780; 714/786; 714/792; 714/794

(58) Field of Classification Search ........... 714/755, 714/780, 792, 786; 341/59; 375/262
See application file for complete search history.

(56) References Cited

U.S. PATENT DOCUMENTS

| | | | |
|---|---|---|---|
| 6,188,717 B1 * | 2/2001 | Kaiser et al. | 375/148 |
| 6,891,897 B1 | 5/2005 | Bevan et al. | |
| 6,898,248 B1 * | 5/2005 | Elgamal et al. | 375/259 |
| 2002/0167962 A1 * | 11/2002 | Kowalski | 370/445 |
| 2004/0146014 A1 | 7/2004 | Hammons, Jr. et al. | |

OTHER PUBLICATIONS

Narayanan, K. R, et al., "Low Complexity Turbo Equalization with Binary Precoding", IEE ICC, Jun. 2000, pp. 1-5.*
Clark, Jr., et al., Error-Correction Coding for Digital Communications, Plenum Press, 1981, pp. 9, 10, 420.*
Peterson, et al., Error-Correcting Codes, 2nd edition, MIT Press 1972, pp. 125, 129-131, 556.*
A. Aggarwal, S. Savage, and T. Anderson, "Understanding the Performance of TCP Pacing," in Proc. Of IEEE Infocom 00, Tel-Aviv, Israel, Mar. 2000.

(Continued)

*Primary Examiner*—Stephen M. Baker
(74) *Attorney, Agent, or Firm*—Shumaker & Sieffert, P.A.

(57) ABSTRACT

In general, joint error-control coding and linear precoding techniques are proposed for fading-resilient transmissions over frequency- at and frequency-selective fading channels encountered with high-rate wireless OFDM transmissions. For example, a wireless communication system includes a transmitter that applies non-linear codes and a linear precoder to a data stream to produce a joint coded-precoded waveform. A receiver receives the joint coded-precoded waveform from the transmitter via a wireless communication channel, and demodulates the joint-coded precoded waveform to produce estimated data. The combination offers a multiplicative benefit to the diversity achievable by the wireless communication system.

29 Claims, 7 Drawing Sheets

OTHER PUBLICATIONS

D. Agrawal, V. Tarokh, A. Naguib, and N. Seshadri, "Space-Time Coded OFDM for High Data-Rate Wireless Communication Over Wideband Channels," Proc. Of Vehicular Technology Conf., pp. 2232-2236, Ottawa, Ont, Canada, May 18-21, 1998.

N. Al-Dhahir, "Single-Carrier Frequency-Domain Equalization for Space-Time Block-Coded Transmissions over Frequency-Selective Fading Channels," IEEE Communications Letters, vol. 5, No. 7, pp. 304-306, Jul. 2001.

N. Al-Dhahir and A.H. Sayed, "The Finite-Length Multi-Input Multi-Output MMSE-DFE," IEEE Trans. On Signal Processing, vol. 48, No. 10, pp. 1-38, Oct. 2000.

S.L. Ariyavistakul, "Turbo Space-Time Processing to Improve Wireless Channel Capacity," IEEE Trans. On Communications, vol. 48, No. 8, pp. 1347-1359, Aug. 2000.

S. Barbarossa and F. Cerquetti, "Simple Space-Time Coded SS-CDMA Systems Capable of Perfect MUI/ISI Elimination," IEEE Communications Letters, vol. 5, No. 12, pp. 471-473, Dec. 2001.

S. Benedetto, G. Montorsi, D. Divsalar, and F. Pollara, "A Soft-Input Soft-Output Maximum A Posterior (MAP) Module to Decode Parallel and Serial Concatenated Codes," TDA Progress Report, vol. 42-127, Nov. 15, 1996, downloadable from http://tmo.ipl.nasa.gov/tmo/progress_report/index.html.

C. Berrou, A. Glavieux, and P. Thitimajsima, "Near Shannon Limit Error-Correcting Coding and Decoding: Turbo Codes (1)," in Proc. Of Intl. Conf. On Com., Geneva, Switzerland, May 1993, pp. 1064-1070.

S. Bhashyam, A.M. Sayeed, and B. Aazhang, "Time-Selective Signaling and Reception for Communication over Multipath Fading Channels," IEEE Trans. On Communications, vol. 48, No. 1, pp. 1-34, Jan. 2000.

E. Biglieri, J. Proakis, and S. Shamai, "Fading Channels: Information-Theoretic and Communications Aspects," IEEE Trans. On Information Theory, vol. 44, No. 6, pp. 2619-2692, Oct. 1998.

J. Boutros and E. Viterbo, "Signal Space Diversity: A Power-and Bandwidth-Efficient Diversity Technique for the Rayleigh Fading Channel," IEEE Transactions on Information Theory, vol. 44, No. 4, pp. 1453-1467, Jul. 1998.

H. Bolcskei and A.J. Paulraj, "Space-Frequency Codes for Broadband Fading Channels," in Proc. of IEEE Int. Symposium on Information Theory, pp. 219, Washington D.C., Jun. 24-29, 2001.

H. Bolcskei and A.J. Paulraj, "Space-Frequency Coded Broadband OFDM Systems," in Proc. of Wireless Communications and Networking, vol. 1, pp. 1-6, Chicago, IL, Sep. 23-28, 2000.

D.K. Borah and B. Hart, "Receiver Structures for Time-Varying Frequency-Selective Fading Channels," IEEE Journal on Selected Areas in Communications, vol. 17, No. 11, pp. 1863-1874, Nov. 1999.

J.K. Cavers, "Optimized Use Of Diversity Modes In Transmitter Diversity System," in Proc. of the Vehicular Technology Conf., vol. 3, Amsterdam, The Netherlands, 1999, pp. 1768-1773.

D. Dardari and V. Tralli, "High-Speed Indoor Wireless Communications at 60 GHz with Coded OFDM," IEEE Transactions on Communications, vol. 47, No. 11, pp. 1709-1721, Nov. 1999.

V.M. DaSilva and E. S. Sousa, "Fading-Resistant Modulation Using Several Transmitter Antennas," IEEE Transactions on Communications, vol. 45, No. 10, pp. 1236-1244, Oct. 1997.

A. Duel-Hallen, S. Hu, and H. Hallen, "Long-Range Prediction of Fading Signals," IEEE Signal Processing Magazine, pp. 62-75, May 2000.

S. Floyd, M. Handley, J. Padhye, and J. Widmer, "Equation-Based Congestion Control for Unicast Applications," in Proc. Of SIGCOMM'00.

G.J. Foschini and M.J. Gans, "On Limits of Wireless Communications in a Fading Environment When Using Multiple Antennas," Wireless Personal Communications, vol. 6, No. 3, pp. 311-335, Mar. 1998.

G.B. Giannakis, X. Ma, G. Leus, and S. Zhou, "Space-Time-Doppler Coding Over Time-Selective Fading Channels With Maximum Diversity And Coding Gains," Proc. Of Intl. Conf. On ASSP, Orlando, FL, May 13-17, 2002, pp. III-2217-III-2220.

G.B. Giannakis and S. Zhou, "Optimal Transmit-Diversity Precoders for Random Fading Channels," in Proc. of Globecom Conf., vol. 3, San Francisco, CA, Nov. 27-Dec. 1, 2000.

G.B. Giannakis and C. Tepedelenlioglu, "Basis Expansion Models and Diversity Techniques for Blind Identification and Equalization of Time-Varying Channels," Proceedings of the IEEE, vol. 86, No. 10, pp. 1969-1986, Oct. 1998.

X. Giraud, E. Boutillon, and J.C. Belfiore, "Algebraic Tools to Build Modulation Schemes for Fading Channels," IEEE Transactions on Information Theory, vol. 43, pp. 938-952, May 1997.

D. Gore, S. Sandhu, and A. Paulraj, "Delay Diversity Code for Frequency Selective Channels," Electronics Letters, vol. 37, No. 20, pp. 1230-1231, Sep. 27, 2001.

J. Hagenauer, and P. Hoeher, "A Viterbi Algorithm with Soft-Decision Outputs and Its Applications," in Proc. Of the IEEE 1989 Global Communications Conference, Dallas, Texas, pp. 1680-1686, Nov. 1989.

B. Hassibi and B.M. Hochwald, "High-Rate Codes that are Linear in Space and Time," IEEE Trans. On Information Theory, pp. 1-56, revised Apr. 2001; URL: http://mars.bell-labs.com/cm/ms/what/mars/index.html.

A. Hiroike, F. Adachi, and N. Nakajima, "Combined Effects of Phase Sweeping Transmitter Diversity and Channel Coding," IEEE Trans. On Vehicular Technology, pp. 170-176, May 1992.

R. Hoshyar, S.H. Jamali, and A.R.S. Bahai, "Turbo Coding Performance in OFDM Packet Transmissions," in Proc. IEEE VTC, Tockyo, Japan, 2000, vol. 2, pp. 805-810.

S.A. Jafar, S. Vishwanath, and A. Goldsmith, "Channel Capacity and Beamforming for Multiple Transmit and Receive Antennas with Covariance Feedback," in Proc. of International Conference on Communications, vol. 7, Helsinki, Finland, Jun. 2001.

G. Jongren, M. Skoglund, and B. Ottersten, "Combining Transmit Beamforming and Orthogonal Space-Time Block Codes by Utilizing Side Information," IEEE Sensor Array and Multichannel Signal Processing Workshop, Mar. 14, 2000.

G. Jongren, M. Skoglund, and B. Ottersten, "Combining Transmit Antenna Weights and Orthogonal Space-Time Block Codes by Utilizing Side Information," In Proceedings of the $33^{rd}$ Asilomar Conference on Signals, Systems and Computers, Oct. 23, 1999.

G. Jongren and M. Skoglund, "utilizing Quantized Feedback Information in Orthogonal Space-Time Block Coding," in Proceedings IEEE Global Telecommunications Conference, Nov. 27, 2000.

G. Kaplan and S. Shamai, "Achievable Perfomance Over the Correlated Rician Channel," IEEE Transactions on Communications, vol. 42, No. 11, pp. 2967-2978, Nov. 1994.

W. Y. Kuo and M.P. Fitz, "Design and Analysis of Transmitter Diversity Using Intentional Frequency Offset for Wireless Communications," IEEE Trans. On Vehicular Technology, vol. 46, No. 4, pp. 871-881, Nov. 1997.

B. Le Floch, M. Alard, and C. Berrou, "Coded Orthogonal Frequency Division Multiplex," Proceedings of the IEEE, vol. 83, No. 6, pp. 982-996, Jun. 1995.

G. Leus, S. Zhou, and G.B. Giannakis, "Multi-User Spreading Codes Retaining Orthagonality through Unknown Time- and Frequency-Selective Fading," Proc. Of GLOBECOM, vol. 1, pp. 259-263, San Antonio, TX, Nov. 25-29, 2001.

Y. Li, "Simplified Channel Estimation for OFDM Systems With Multiple Transmit Antennas," IEEE Transactions On Wireless Communications, vol. 1, No. 1, pp. 67-75, Jan. 2002.

E. Lindskog and A. Paulraj, "A Transmit Diversity Scheme for Channels with Intersymbol Interference," Proceedings Of International Conference On Comm., vol. 1, pp. 307-311, Jun. 2000.

Y. Liu, M. P. Fitz, and O. U. Takeshita, "Space-Time Codes Performance Criteria and Design for Frequency Selective Fading Channels," Proc. Of International Conference on Comm., Helsinki, Finland, Jun. 11-15, 2001.

Z. Liu, Y. Zin, and G.B. Giannakis, "Linear Constellation Precoding for OFDMW With Maximum Multipath Diversity and Coding Gains," IEEE Transactions On Communications, vol. 51, No. 3, pp. 416-427, Mar. 2003.

Z. Liu, Y. Xin, and G.B. Giannakis, "Space-Time-Frequency Coded OFDM Over Frequency-Selective Fading Channels," IEEE Transactions on Signal Processing, vol. 50, No. 10, pp. 2465-2476, Oct. 2002.

Z. Liu, Y. Xin, and G.B. Giannakis, "Space-Time-Frequency Trellis Coding Frequency-Selective Fading Channels", pp. 145-149, 2002.

Z. Liu, Y. Xin, and G.B. Giannakis, "Space-Time-Frequency Block Coded OFDM with Subcarrier Grouping and Constellation Precoding," Proc. Of Intl. Conf. on ASSP, Orlando, FL, May 13-17, 2003, pp. III-2205-III-208.

B. Lu and X. Wang, "Space-Time Code Design in OFDM Systems," Proc. Of Global Telecommunications Conferences, San Francisco, CA, vol. 2, pp. 1000-1004, Nov. 27-Dec. 1, 2000.

X. Ma and G.B. Giannakis, "Space-Time Coding for Doubly-Selective Channels," Proc. Of Intl. Conf. On Circuits and Systems, Scottsdale, AZ, May 25-29, 2002, pp. III-647-III-650.

X. Ma and G.B. Giannakis, "Maximum-Diversity Transmission over Time-Selective Wireless Channels," Proc. of Wireless Communications and Networking Conf., Orlando, FL, Mar. 17-21, 2002, pp. 497-501.

X. Ma and G.B. Giannakis, "Maximum-Diversity Transmission Over Doubly Selective Wireless Channels," IEEE Transactions On Informormation Theory, vol. 49, No. 7, pp. 1832-1840, Jul. 2003.

X. Ma, C. Tepedelenlioglu, G.B. Giannakis, and S. Barbarossa, "Non-Data-Aided Carrier Offset Estimators for OFDM With Null Subcarriers: Identifiability, Algorithms, and Performance," IEEE Journal on Selected Areas in Communications, vol. 19, No. 12, pp. 2504-2515, Dec. 2001.

I. Mahdavi and S. Floyd, "TCP-Friendly Unicast Rate-Based Flow Control," Jan. 1997, http://www.psc.edu/networking/papers/tcp_friendly.html.

M. Martone, "Wavelet-Based Separating Kernels for Sequence Estimation with Unknown Rapidly Time-Varying Channels," IEEE Communications Letters, vol. 3, No. 3, pp. 78-80, Mar. 1999.

M. Mathias, J. Semke, J. Mahdavi, and T. Ott, "The Macroscopic Behavior of the TCP Congestion Avoidance Algorithm," Computer Communication Review, Vo. 27 No. 3, Jul. 1997, pp. 1-16.

B. Muquet, M. de Courville, G.B. Giannakis, Z. Wang, and P. Duhamel, "Reduced Complexity Equalizers For Zero-Padded OFDM Transmissions".

A.F. Naguib, "On The Matched Filter Bound of Transmit Diversity Techniques," IEEE International Conference on Communications, vol. 2, pp. 596-603, Helsinki, Finland, Jun. 11-14, 2001.

A. Narula, M.J. Lopez, M.D. Trott, and G.W. Wornell, "Efficient Use of Side Information in Multiple-Antenna Data Transmission over Fading Channels," IEEE Journal on Selected Areas In Communications, vol. 16, No. 8, pp. 1423-1436, Oct. 1998.

A. Narula, M.D. Trott, and G.W. Wornell, "Performance Limits of Coded Diversity Methods for Transmitter Antenna Arrays," IEEE Transactions On Information Theory, vol. 45, No. 7, pp. 2418-2433, Nov. 1999.

S. Ohno amd G.B. Giannakis, "Optimal Training and Redundant Precoding for Block Transmissions With Application to Wireless OFDM," IEEE Transaction on Communications, vol. 50, No. 12, pp. 2113-2123, Dec. 2002.

M.F. Pop and N.C. Beaulieu, "Limitations of Sum-of-Sinusoids Fading Channel Simulators," IEEE Transactions On Communications, vol. 49, No. 4, pp. 699-708, Apr. 2001.

R. Rajaie, H. Yu., M. Handely, and D. Estrin, "Multimedia Proxy Caching Mechanism for Quality Adaptive Streaming Applications in the Internet," Technical report 99-709, Computer Science Department, USC.

R. Rajaie, M. Handely, and D. Estrin, "Quality Adapation for Congestion Controlled Video Playback over the Internet," in Proc of SIGCOMM'99, pp. 1-16.

S. Sen, J. Rexford, and D. Towsley, "Proxy Prefix Caching for Multimedia Streams," in Proc. of IEEE INFOCOM'99.

L. Rizzo, IP Dummynet, pp. 1-9, http://info.iet.unipi.it/luigi/ip_dummynet/.

O. Rose, "Statistical Properties of MPEG Video Traffic and Their-Impact on Traffic Modeling in ATM Network," TR-101, Institute of Computer Science, University of Wurzburg, Germany, Feb. 1995, pp. 1-25.

M. Rouanne and D.J. Costello, Jr., "An Algorithm for Computing the Distance Spectrum of Trellis Codes," IEEE Journal on Selected Areas in Communications, vol. 7, No. 6, pp. 929-940, Aug. 1989.

A. Ruiz, J.M. Cioffi, and S. Kasturia, "Discrete Multiple Tone Modulation with Coset Coding for the Spectrally Shaped Channel," IEEE Transactions on Communications, vol. 40, No. 6, pp. 1012-1029, Jun. 1992.

H.R. Sadjadpour, "Application of Turbo Codes for Discrete Multi-Tone Modulation Schemes," in Proc. Of Intl. Conf. On Com., Vancouver, Canada, 1999, vol. 2, pp. 1022-1027.

A.M. Sayeed and B. Aazhang, "Joint Multipath-Dopple Diversity in Mobile Wireless Communications," IEEE Transactions On Communications, vol. 47, No. 1, pp. 123-132, Jan. 1999.

D.-S. Shiu, G.J. Foschini, M.J. Gans, and J.M. Kahn, "Fading Correlation and Its Effect on the Capacity of Multielement Antenna Systems," IEEE Transactions on Communications, vol. 48, No. 3, pp. 502-513, Mar. 2000.

A. Stamoulis, G.B. Giannakis, and A. Scaglione, "Block FIR Decision-Feedback Equalizers for Filterbank Precoded Transmisisons with Blind Channel Estimation Capabilities," IEEE Transactions On Communications, vol. 49, No. 1, pp. 69-83, Jun. 2001.

L. Sylla, P. Fortier, and H.T, Huynh, "Performance of COFDM Using Turbo Codes," in Proc. Of IEEE Canadian Conference on Electrical and Computer Engineering, Edmonton, Alta, Canada, May 9-12, 1999.

V. Tarokh, H. Jafarkhani, and A.R. Calderbank, "Space-Time Block Codes from Orthogonal Designs," IEEE Transactions On Information Theory, vol. 45, No. 5, pp. 1456-1467, Jul. 1999.

C. Tepedelenlioglu and G.B. Giannakis, "Transmitter Redundancy for Blind Estimation and Equalization of Time- Frequency-Selective Channels," IEEE Transactions On Signal Processing, vol. 48, No. 7, pp. 2029-2043, Jul. 2000.

M.K. Tsatsanis and G.B. Giannakis, "Modelling and Equalization of Rapidly Fading Channels," International Journal of Adaptive Control and Signal Processing, vol. 10, pp. 159-176, 1996.

E. Visotsky and U. Madhow, "Space-Time Transmit Precoding With Imperfect Feedback," IEEE Transactions on Information Theory, vol. 47, No. 6, pp. 2632-2639, Sep. 2001.

A.J. Viterbi, "An Intuitive Justification and a Simplified Implementation of the MAP Decoder for Convolutional Codes," IEEE Journal on Selected Areas in Communications, vol. 16, No. 2, pp. 260-264, Feb. 1998.

E. Viterbo, and J. Boutros, "A Universal Lattice Code Decoder for Fading Channels," IEEE Transactions on Information Theory, vol. 45, No. pp. 1639-1642, Jul. 1999.

J. Vogy, K. Joora, A. Finger, and G. Fettweis, "Comparison of Different Turbo Decoder Realizaftions For IMT-2000," in Global Telecommunications Conference—GLOBECOM'99, Rio de Janeiro, Brazil, 1999, vol. 5, pp. 2704-2708.

F.W. Vook and T.A. Thomas, "Transmit Diversity Schemes for Broadband Mobile Communication System," Proc. Of Vehicular Tech. Conf., vol. 6, pp. 2523-2529, Boston MA, Sep. 24-28, 2000.

H. Wang, J. Belzile, and C.L. Despins, "64-QAM OFDM With TCM Coding and Waveform Shaping In A Time-Selective Rician Facing Channel," in Proc. Of Int'l Zurich Seminar on Broadband Comm., Berdum, Que., Canada, 2000, pp. 257-261.

X. Wang and H.V. Poor, "Iterative (Turbo) Soft Interface Cancellation and Decoding for Coded CDMA," IEEE Transactions on Communications, vol. 47, No. 7, pp. 1046-1061, Jul. 1999.

Y. Wang, Z.-L. Zhang, D. Du, and D. Su, "A Network-Conscious Approach to End-to-End Video Delivery Over Wide Area Networks Using Proxy Servers," in Proceedings of IEEE INFOCOM'98.

Z. Wang, S. Zhou, and G.B. Giannakis, "Joint Coding-Precoding with Low Complexity Turbo-Decoding," IEEE Transactions on Wireless Communications, vol. XXX, no. XXX, pp. 1-11, Month 2003; also in Proc. Of the European Wireless Conference, Florence, Italy, Feb. 25-28.

Z. Wang and G.B. Giannakis, "Lineraly Precoded or Coded OFDM against Wireless Channel Fades?" in Third IEEE Signal Processing Workshop on Signal Processing Advances in Wireless Communication, Taoyuan, Taiwan, Mar. 20-23, 2001.

Z. Wang and G.B. Giannakis, "Complex-Field Coding for OFDM Over Fading Wireless Channels" IEEE Transactions on Information Theory, vol. 49, No. 3, pp. 707-720, Mar. 2003.

Z. Wang and G.B. Giannakis, "Wireless Multicarrier Communications: Where Fourier Meets Shannon," IEEE Signal Processing Magazine, vol. 17, No. 3, pp. 29-48, May 2000.

A. Wittneben, "A New Bandwidth Efficient Transmit Antenna Modulation Diversity Scheme for Linear Digital Modulation," Proc. of IEEE International Conference on Comm., vol. 3, pp. 1630-1634, Geneva, Switzerland, May 23-26, 1993.

Y. Xin, Z. Wang, and G.B. Giannakis, "Space-Time Constellation-Rotating Codes Maximizing Diversity and Coding Gains," Proc. Of GLOBECOM, vol. 1, pp. 455-459 San Antonio, TX, Nov. 25-27, 2001.

Q. Yan, R.S. Blum, "Robust Space-Time Block Coding for Rapid Fading Channels," IEEE Global Telecommunications Conference, vol. 1, pp. 460-464, San Antonio, TX, Nov. 25-29, 2001.

Z.-L. Zhang, S. Nelakuditi, R. Aggarwal, and R. Tsang, "Efficient Selective Frame Discard Algorithms for Stored Video Delivery across Resource Constrained Networks," in Proc. of IEEE INFOCOM'99, pp. 1-26.

S. Zhou, G.B. Giannakis, and C. Le Martret "Chip-Interleaved Block-Spread Code Division Multiple Access," IEEE Transactions On Communications, vol. 50, No. 2, pp. 235-248, Feb. 2002.

S. Zhou and G.B. Giannakis, "Optimal Transmitter Eigen-Beamforming and Space-Time Block Coding Based on Channel Correlations," IEEE Trans. Signal processing, vol. 50, No. 10, pp. 553-557, Oct. 2002.

S. Zhou and G.B. Giannakis, "Space-Time Coding With Maximum Diversity Gains Over Frequency-Selective Fading Channels," IEEE Signal Processing Letter, vol. 8, No. 10, pp. 269-272, Oct. 2001.

S. Zhou, Z. Wang, N. Bapat, G.B. Giannakis, "Turbo Decoding of Error Control Coded and Unitary Precoded OFDM", pp. 1237-1241, University of Minnesota.

S. Zhou, B. Muquet, and G.B. Giannakis, "Subspace-Based (Semi-) Blind Channel Estimation for Block Precoded Space-Time OFDM," IEEE Transactions on Signal Processing, vol. 50, No. 5, pp. 1215-1228, May 2002.

* cited by examiner

WIRELESS COMMUNICATION SYSTEM HAVING ERROR-CONTROL CODER AND LINEAR PRECODER

This application claims priority from U.S. Provisional Application Ser. No. 60/374,886, filed Apr. 22, 2002, U.S. Provisional Application Ser. No. 60/374,935, filed Apr. 22, 2002, U.S. Provisional Application Ser. No. 60/374,934, filed Apr. 22, 2002, U.S. Provisional Application Ser. No. 60/374,981, filed Apr. 22, 2002, U.S. Provisional Application Ser. No. 60/374,933, filed Apr. 22, 2002, the entire contents of which are incorporated herein by reference.

STATEMENT REGARDING FEDERALLY SPONSORED RESEARCH OR DEVELOPMENT

This invention was made with Government support under Contract No. ECS-9979443, awarded by the National Science Foundation, and Contract No. DAAG55-98-1-0336 (University of Virginia Subcontract No. 5-25127) awarded by the U.S. Army. The Government may have certain rights in this invention.

TECHNICAL FIELD

The invention relates to communication systems and, more particularly, transmitters and receivers for use in wireless communication systems.

BACKGROUND

In wireless mobile communications, a channel that couples a transmitter to a receiver is often time-varying due to relative transmitter-receiver motion and multipath propagation. Such a time-variation is commonly referred to as fading, and may severely impair system performance. When a data rate for the system is high in relation to channel bandwidth, multipath propagation may become frequency-selective and cause intersymbol interference (ISI). By implementing Inverse Fast Fourier Transform (IFFT) at the transmitter and FFT at the receiver, Orthogonal Frequency Division Multiplexing (OFDM) converts an ISI channel into a set of parallel ISI-free subchannels with gains equal to the channel's frequency response values on the FFT grid. A cyclic prefix, which is inserted before each transmitted block and is removed from each received block, is used to reduce or eliminate inter-block interference that is induced by the ISI channel.

To mitigate fading effects, whether frequency-flat or frequency-selective, many conventional wireless systems often employ some form of error-control coding (EC). Examples of popular EC schemes include block codes, e.g., (Reed-Solomon or BCH), convolutional codes, Trellis or coset codes, and Turbo-codes. Some of these codes also require Channel State Information (CSI) at the transmitter, which may be unrealistic or too costly to acquire in wireless applications where the channel changes on a constant basis.

OFDM affords simple channel equalization because it renders the ISI channel equivalent to a number of single-tap ISI-free subchannels, and thus only a one-tap division is needed to equalize each subchannel. However, without EC coding, OFDM transmissions are reliably decoded only when the channel does not experience deep fades (frequency nulls), or, when the transmitter has CSI so that the subchannels with deep fades are excluded from carrying information.

Diversity is another counter-measure that can be used against fading, and comes in different forms, including frequency, time, and space. Diversity manifests itself in the average system performance as the asymptotic slope of the error-rate versus signal-to-noise ratio (SNR) curve in a log-log scale (asymptotic in SNR). Increased diversity order is therefore desired to achieve high performance. EC coding can achieve certain order of diversity, but to increase diversity, an increase in decoding complexity is usually necessary. For example, with convolutional coding, diversity increase can lead to an exponential increase in decoding complexity.

SUMMARY

In general, techniques are described that combine error-control (EC) coding and complex field linear precoding with small size precoders to improve diversity gain and, as a result, system performance. By making use of linear precoding, a form of "signal space diversity" can be achieved. With linear precoding alone, however, maximum multipath-diversity can only be achieved at a price of increased complexity, possibly exponentially. As a result, the techniques make use of small-size precoders. The techniques, however, utilize linear precoding in combination with error-control coding to achieve maximum diversity, even for relatively small linear precoders. The error-control coding operates over a field that is restricted in code length and alphabet size, i.e. a finite field. In contrast, the linear precoding operates over a complex field with no restriction on the input symbol alphabet or the precoded symbol alphabet.

Moreover, an iterative decoding algorithm is described for the joint coding-precoding scheme with a complexity only a few times that of an EC coded system without preceding. When EC coding or LP is used alone, the same amount of increase in complexity will only allow for a much smaller increase in diversity order, as compared to the multiplicative diversity. The concatenated coding-precoding scheme is described with bit-interleaving at the transmitter for frequency-selective channels with OFDM, and also for frequency-flat channels with single-carrier transmissions.

In one embodiment, a wireless communication device comprises a coder, a precoder that operates over a complex field with no restriction to alphabet size, and a modulator. The coder encodes a data stream to produce an encoded data stream. The precoder linearly precodes the encoded data stream to produce a precoded data steam. The modulator produces an output waveform in accordance with the precoded data stream for transmission through a wireless channel.

In another embodiment, a wireless communication device comprises a demodulator and a decoder. The demodulator receives a waveform carrying a joint coded-linearly precoded transmission and produces a demodulated data steam. The decoder applies iterative decoding techniques to decode the demodulated data and produce estimated data.

In another embodiment, a system comprises a transmitter that applies codes and a linear precoder to a data stream to produce a joint coded-precoded waveform. A receiver receives the joint coded-precoded waveform from the transmitter via a wireless communication channel, and demodulates the joint-coded precoded waveform to produce estimated data.

In another embodiment, a method comprises encoding a data stream with codes to produce an encoded data stream, and applying a linear precoder to the encoded data stream to produce a precoded data stream, wherein the linear precoder operates over a complex field with no restriction to alphabet size.

In another embodiment, a method comprises demodulating a waveform carrying a joint coded-linearly precoded transmission to produce a demodulated data stream, and iteratively decoding the demodulated data to produce estimated data.

In another embodiment, a computer-readable medium comprises instructions to cause a programmable processor to encode a data stream with codes to produce an encoded data stream, apply a linear precoder to the encoded data stream to produce a precoded data stream, wherein the linear precoder operates over a complex field with no restriction to alphabet size, modulate the precoded data stream to produce an output waveform; and transmit the output waveform through a wireless channel.

In another embodiment, a computer-readable medium comprising instructions to cause a programmable processor to demodulate a waveform carrying a joint coded-linearly precoded transmission to produce a demodulated data stream, apply maximum a posteriori (MAP) decoding to blocks of symbols within the demodulated data stream to compute soft symbol information, apply MAP decoding to the soft symbol information to compute soft bit information, and output estimated data based on the soft bit information.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
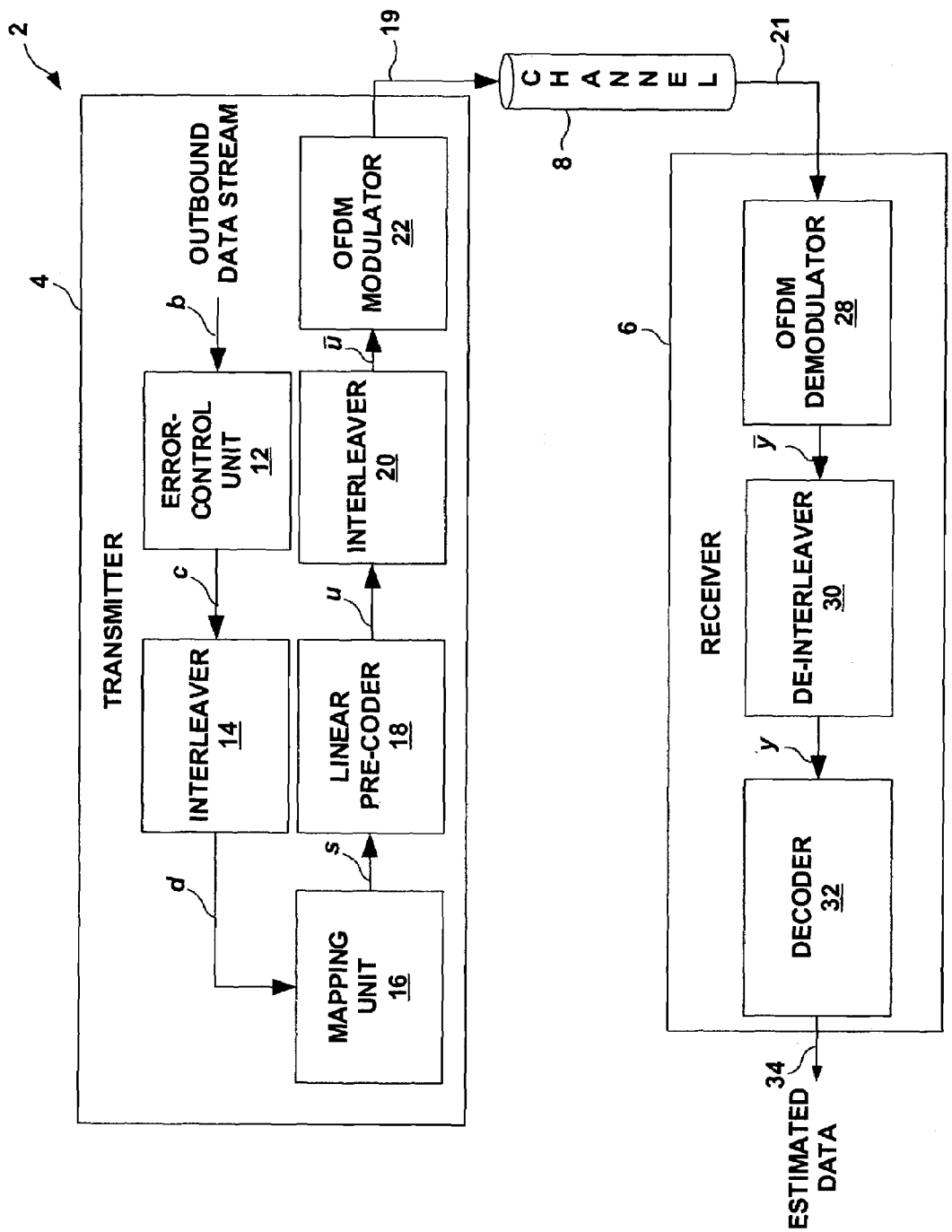
FIG. 1 is a block diagram illustrating an exemplary telecommunication system in which a transmitter and receiver implement the combined error-control (EC) coding and complex field linear precoding techniques.

FIG. 1 is a block diagram illustrating a telecommunication system 2 in which transmitter 4 communicates data to receiver 6 through wireless channel 8. In general, the wireless communication techniques described herein provide an efficient technique for estimating and compensating for effects of channel 8.

Transmitter 4 transmits data to receiver 6 using one of a number of conventional multi-user transmission formats including Code Division Multiple Access (CDMA) and Orthogonal Frequency Division Multiplexing (OFDM). The former is an example of single-carrier multiple access scheme, while the latter is a multi-carrier scheme. OFDM has been adopted by many standards including digital audio and video broadcasting (DAB, DVB) in Europe and high-speed digital subscriber lines (DSL) in the United States. OFDM has also been proposed for local area mobile wireless broadband standards including IEEE802.11a, MMAC and HIPERLAN/2. In one embodiment, system 2 represents an LE-OFDM system having N subchannels.

The techniques described herein may be applied to uplink and/or downlink transmissions, i.e., transmissions from a base station to a mobile device and vice versa. Consequently, transmitters 4 and receivers 6 may be any device configured to communicate using a multiuser wireless transmission including a cellular distribution station, a hub for a wireless local area network, a cellular phone, a laptop or handheld computing device, a personal digital assistant (PDA), and the like.

In general, the techniques are illustrated in reference to two types of transmissions through time-varying (fading) channels: frequency selective and frequency-flat. With OFDM and sufficient interleaving, the former can be described by the same model as the latter, which enables a unified design and analysis for multicarrier and single-carrier systems. Application of the described joint coding-precoding techniques to either system leads to improved performance.

In the illustrated embodiment, transmitter 4 includes an error-control unit 12, an interleaver 14, a mapping unit 16, a linear pre-coder 18, an interleaver 20, and an OFDM modulator 22. Initially, error-control unit 12 processes an outbound data stream, which represents a stream of information bits, and encodes the outbound data stream using EC coding. For example, error-control unit 12 may utilize conventional convolutional or turbo codes, or other applicable codes that operate over a finite field restricted in alphabet size. In contrast, linear pre-coder 18 operates over a complex field with no restriction on the input symbol alphabet or the precoded symbol alphabet. Interleaver 14, represented as herein as $\Pi_1$, processes coded symbols c, and outputs permuted symbols d.

Mapping unit 16 maps the symbols d to constellation symbols s. We let A denote the constellation alphabet, and |A| its size. In particular, every $\log_2 |A|$ consecutive symbols of d are mapped to one constellation symbol when d is binary. Possible constellations include binary phase-shift keying (BPSK), quadrature phase shift keying (QPSK), and M-ary quadrature amplitude modulation (QAM).

After constellation mapping, linear pre-coder 18 processes successive blocks of M symbols $s_i := [s_{iM}, s_{iM+1}, \ldots, s_{iM+M-1}]^T$ to linearly precode the blocks using a matrix $\Theta$ of size M×M to obtain a precoded block $u_i = \Theta s_i$. The block size M may be varied. Each block $u_i$ is serialized to $u_{iM}, u_{iM+1}, \ldots, u_{iM+M-1}$.

A second interleaver 20, represented herein as $\Pi_2$, interleaves the precoded symbols u to decorrelate channel 8 in the frequency domain. With a sufficiently increased size, interleaver 20 can also decorrelate channel 8 in the time-domain, although this can be achieved equally well by increasing the size of interleaver 14. The output of interleaves 20, denoted by $\bar{u}_n = \Pi_2[u_n]$, is passed on to the OFDM modulator 22, which includes serial-to-parallel conversion to blocks of size N (the OFDM symbol size), IFFT, and cyclic prefix insertion. The resulting output is serialized for transmission.

The two interleavers 14, 20 in system 4 serve different purposes. In particular, interleaver 14 separates the coded bits c so that mapping unit 16 maps neighboring bits to different constellation symbols, and finally precoded into different blocks by linear pre-coder 18. The main role of interleaver 20, on the other hand, is to permute each block of linearly precoded symbols u in the frequency domain. In this manner, interleaver 14 may be viewed as a bit interleaver, while interleaver 20 may be viewed as a symbol interleaver.

In one embodiment, interleaver 20 has a size equal to the OFDM symbol size N, where N is the number of subcarriers, and interleaver 14 has a size>>N. Interleaver 14 may spread consecutive input bits by a distance of at least M in the output bit stream, where M is the symbol block size of interleaver 20. In this respect, block interleavers may be preferred over random interleavers, although it may also be preferred to avoid systematic patterns in the output of interleavers 14, 20.

Receiver 6 includes OFDM demodulator 28, de-interleaver 30 and decoder 32. Receiver 6 receives waveform 26, which typically is a function of the transmission waveform 24 and the channel 8. A serial-to-parallel converter (not shown) samples waveform 26, buffers the discrete data and groups the data into blocks of size N. Demodulator 28 discards the Cyclic Prefix of the incoming blocks, thereby producing blocks of M symbols, and applies a Fast Fourier Transform of length M to demodulate data.

De-interleaver 30 receives post-FFT data, i.e., the demodulated data, from demodulator 28 and reassembles each block of linearly precoded symbols y that have been permuted in the frequency domain by interleaver 20.

In particular, the lth resulting sample $\bar{y}_{(k-1)N+l}$ in the kth demodulated OFDM symbol can be written as:

$$\bar{y}_{(k-1)N+l} = H(l/N)\bar{u}_{(k-1)N+l} + \bar{\eta}_{(k-1)N+l}, \ l \in [0, N-1],$$
$$k=0, 1 \quad (1)$$

where $\bar{\eta}$ is the FFT processed additive white Gaussian noise (AWGN). The variance of the noise is $N_0/2$ per real dimension. Since the FFT is a linear transform, the frequency response variates $\{H(l/N): l \in [0, N-1]\}$ are also complex Gaussian. Although the FFT is an orthogonal transformation, if N>L+1, the N variates are correlated even though the (L+1) impulse response taps are independent. Defining $y_n := \Pi_2^{-1}[\bar{y}_n]$, $\eta_n := \Pi_2^{-1}[\bar{\eta}_n]$, and $\alpha_n := \Pi_2^{-1}[H((n \mod N)/N)]$, then the deinterleaved version of (1) produced by deinterleaver 28 can be expressed as $$y_n = \alpha_n u_n + \eta_n. \quad (2)$$

With a well designed interleaver 20 ($\Pi_2$) of large enough size, the correlation between $\alpha_n$'s can be greatly reduced.

Notably, equation (2) also corresponds to the input-output relationship of a single-carrier transmission through a flat-fading channel, where the block diagram of FIG. 1 is still valid without the OFDM modulator 22 and OFDM demodulator 28. The multicarrier transmissions with OFDM and single-carrier transmissions over frequency-flat channels are both examples of ISI-free transmissions, and the joint coding-precoding techniques described herein can be directly applied to both.

Decoder 32, as described in detail below, applies iterative decoding techniques to decode the joint coded-precoded transmission provided by transmitter 4. In particular, as described in further detail in reference to FIG. 2, decoder 32 iteratively applies maximum a posteriori (MAP) decoding to symbols y to produce estimated data 34.

According to the techniques described herein, signal space diversity for frequency-selective fading can be achieved by rotating the M-dimensionial vectors $s_i \in A^M$ using a unitary matrix $\Theta$ so that the resulting signal set $U := \{u: u = \Theta s, s \in A^M\}$ possesses the following full diversity property:

$$\forall s_i, s_i' \in \mathcal{A}^M, \text{ if } s_i \neq s_i', \text{ then } [\Theta s_i]_k \neq [\Theta s_i']_k, \forall k \in [1, M], \quad (3)$$

where $[\cdot]_k$ denotes the kth entry of a vector. In words, for two distinct blocks, their precoded (rotated) counterparts are different in all their components. With this property, if each component $[u_i]_k$ of a rotated block $u_i$ goes through a fading channel, and is thus scaled by an independent fading coefficient $\alpha_n$, then as long as one of the M coefficients $\alpha_n$ is not too small, one can uniquely detect $s_i$ from the rotated vectors $u_i = \Theta s_i$.

Suppose now that the precoded symbols $\Theta s_i$ pass through an ISI-free fading channel modeled as in (2). Using Chernoff bounding techniques, the probability of block errors can be approximated $P_E := P(u_i \to u_j, i \neq j)$, by $$P_E \approx (G_c \cdot SNR)^{-G_d}, \quad (4)$$

where the diversity gain $G_d$ is the minimum Hamming distance between the linearly precoded vectors $u_i, u_j \in U$; i.e., recalling that $|\{\cdot\}|$ denotes the cardinality of a set, we have:

$$G_d = \min_{u_i \neq u_j} |\{k: [u_i]_k \neq [u_j]_k\}|.$$

Note that $G_d$ determines the slope of the error rate versus an appropriately defined SNR curve, while the coding gain $G_c$ in (4) measures savings in SNR as compared to a fictitious system with error rate given by $(1/SNR)^{G_d}$. Both $G_d$ and $G_c$ depend on the choice of $\Theta$, and a full (maximum) diversity is indeed achieved by precoders satisfying the full diversity property (3).

Signal space diversity offers a bandwidth-efficient countermeasure against fading in the sense that it does not reduce the transmission rate. Matrix $\Theta$ is referred to as a "linear precoder" because it implements a linear transformation. In order to enable full signal space diversity, it does not have to be unitary. However, there are indeed good reasons that motivate unitary precoders:

i) A unitary precoder $\Theta$ does not change the Euclidean distances between the M-dimensional vectors $\{s_i\}$, and hence unitary precoding does not alter performance when the channel is purely AWGN (with no fading);

ii) For certain sizes M, the "best" precoders in terms of maximizing diversity and coding gains often turn out to be unitary.

The techniques described herein combine the strengths of EC coding and the linear precoding. Linear precoding alone can achieve a diversity of order M with a well-designed precoder $\Theta$ over a fast flat fading channel. In the limit (M→∞), the M×M precoder $\Theta$ converts a Rayleigh fading channel to an AWGN channel. The price paid is twofold. First, to collect full diversity gains, maximum likelihood (ML) decoding is needed. ML decoding is an NP-hard problem, although the universal lattice decoder (a.k.a. sphere decoder) call approach ML performance in polynomial time. Therefore, linear precoding enables large diversity at high decoding complexity. Second, since the ideal linear precoder with M→∞ renders the fading channel equivalent to an AWGN cone, its performance is limited by that of an uncoded transmission in AWGN.

Motivated by the need to reduce the ML decoding complexity of linear precoding, the techniques focus on "small" precoders of size $M \leq 4$. Moreover, as described in further detail below, there is often minimal benefit to be gained by using precoders of size $M>4$. For $M \leq 4$ and small size constellations such as BPSK or QPSK, processing power can be expended to perform an exhaustive ML search for decoding.

For $M=2$ and $M=4$, the following precoders have been shown to enable full diversity and maximum coding gain of 1 and 1=2, respectively, for QAM constellations:

$$\Theta_2 = \frac{1}{\sqrt{2}} \begin{bmatrix} 1 & e^{j\frac{\pi}{4}} \\ 1 & e^{j\frac{5\pi}{4}} \end{bmatrix}, \quad (5)$$

$$\Theta_4 = \frac{1}{\sqrt{2}} \begin{bmatrix} 1 & e^{j\frac{\pi}{8}} & e^{j\frac{2\pi}{8}} & e^{j\frac{3\pi}{8}} \\ 1 & e^{j\frac{5\pi}{8}} & e^{j\frac{10\pi}{8}} & e^{j\frac{15\pi}{8}} \\ 1 & e^{j\frac{9\pi}{8}} & e^{j\frac{18\pi}{8}} & e^{j\frac{27\pi}{8}} \\ 1 & e^{j\frac{13\pi}{8}} & e^{j\frac{26\pi}{8}} & e^{j\frac{39\pi}{8}} \end{bmatrix}. \quad (6)$$

In addition, these precoders enable maximum coding and diversity gains, while all their entries have equal norm $|\theta_{k,m}|=1/\sqrt{M}$, $\forall k, m \in [0, M-1]$. This property is useful for analyzing the performance of coded UP-OFDM.

Unlike linear precoding, EC coding is capable of achieving large coding gains even when the channel is AWGN. When used over Rayleigh fading channels, coding is also capable of offering diversity gains. For example, a linear block code with minimum Hamming distance $d_{min}$ incurs the following codeword error probability in Rayleigh fading:

$$P_E \approx \frac{1}{2} A_{d_{min}} \left(2 \frac{E_s}{N_0}\right)^{-d_{min}}, \quad (7)$$

where $E_s$ denotes energy per coded symbol, and $A_{d_{min}}$ is the number of codewords of weight $d_{min}$. The the exponent in (7) can be used to deduce the diversity gain of the code as $d_{min}$. For convolutional codes, the diversity gain equals $d_{free}$ the free-distance of the code. For an (n, k) convolutional code with memory fit, the free distance is upper bounded by:

$$d_{free} \leq (m+1)n. \quad (8)$$

Therefore, for fixed n, the free distance can only increase at the price of increasing the memory m. However, such a diversity increase, which is at best linear in the memory m, will result in an exponential increase in decoding complexity, because the number of trellis states is $2^m$ for binary codes.

Wedding linear precoding with EC coding offers multiplicative increase in diversity: the overall diversity will be the product of the individual diversity orders, as discussed herein. Moreover, iterative (or "turbo") decoding techniques described below are only a few times more complex than the sum of their individual complexities.

Figure 2:
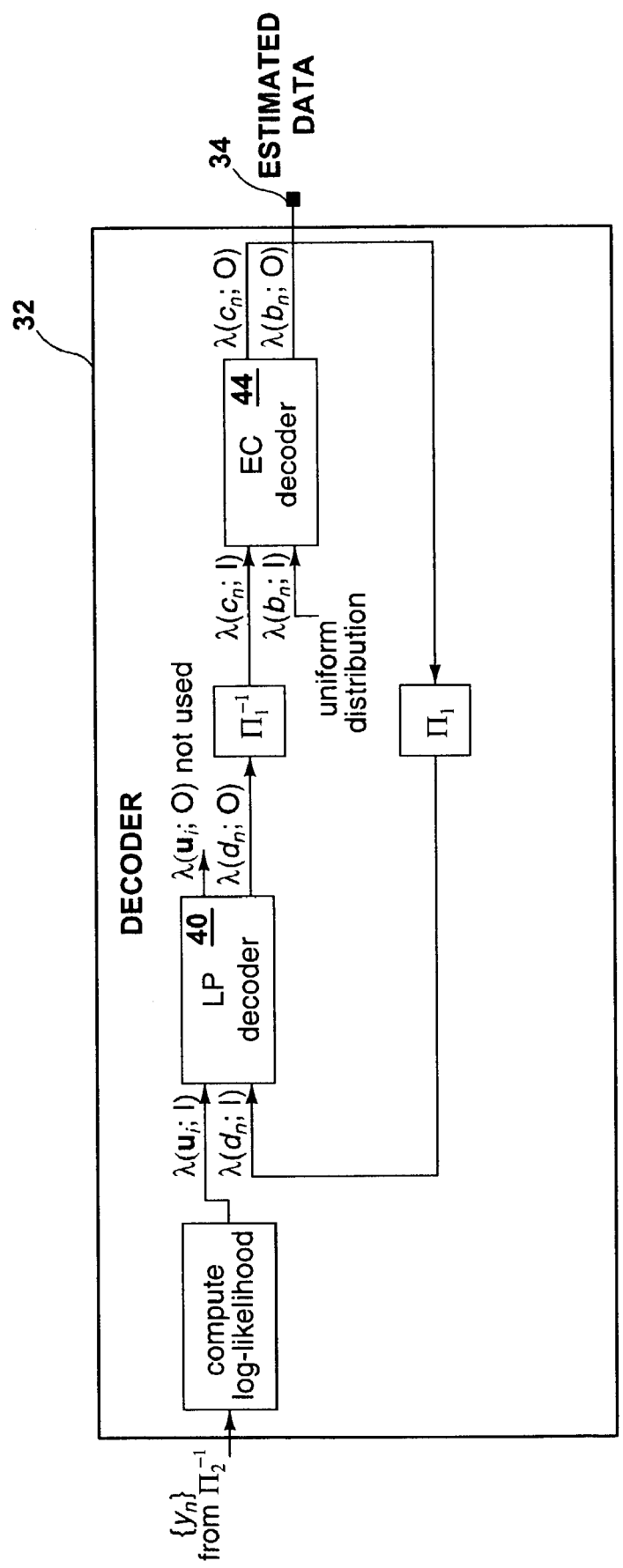
FIG. 2 is a block diagram of an example decoder that implements an iterative decoding scheme.

FIG. 2 is a block diagram of an example decoder 32 that implements an iterative decoding scheme to decode the coded-precoded transmission provided by transmitter 4 (FIG. 1). As illustrated, decoder 32 includes an LP decoder 40 and an EC decoder 44. LP precoder 40 and EC decoder 44 passing soft information 42, 46 and apply maximum a posteriori (MAP) decoding techniques, iteratively. Other approximate MAP modules, such as Max-Log MAP, modified soft-output Viterbi algorithm (SOVA), and the like, can also be used. For exemplary purposes, the iterative decoding scheme will be described in reference to bit-wise MAP decoding.

In one embodiment, each of LP decoder 40 and EC decoder 44 comprises a four-port device that accepts as inputs the probability distribution of both the input and the output of a coder (or a unitary precoder), and outputs an updated probability distribution of both the input and the output, based on the input distribution and the coder (or precoder) structure.

More specifically, the inputs and outputs of the LP decoder 40 and the EC decoder 44 may be in the form of log-likelihood ratios (LLR), denoted by $\lambda(\cdot; I)$ for inputs, and $\lambda(\cdot; O)$ for outputs. For example, $$\lambda(d_n; I) = \log \frac{P[d_n = +1; I]}{P[d_n = -1; I]}; \quad [9]$$

$$\lambda(u_i; I)_{u_i = u} = \log \frac{P[u_i = u; I]}{P[u_i = v; I]}, u \in \mathcal{U}, \quad [10]$$

where in defining $\lambda(u_i; I)$ we can use any fixed $v \in U$ as a reference.

In general, LP decoder 40 implements MAP decoding of the constellation mapped and linearly precoded symbols. In particular, LP decoder outputs extrinsic information $\{\lambda(u_i; O)\}$ and $\{\lambda(d_n; O)\}$, using as input the a priori information $\{\lambda(u_i; I)\}$ and $\{\lambda(d_n; I)\}$. The extrinsic information of a symbol (or symbol vector) is its tog-likelihood ratio given other symbols' (or symbol vectors') prior information, along with the structure of the precoder. In our case, the outputs $\{\lambda(u_i; O)\}$ are not used; hence, we only need to evaluate $\lambda(d_n; O)$, which is the LLR of $d_n$ given $\{d_k: k \neq n\}$'s, priors $\{\lambda(d_k; I): k \neq n\}$, and the priors $\{\lambda(u_i; I)\}$:

$$\lambda(d_n; O) = \log \frac{P[d_n = +1 | \{\lambda(d_k; I): k \neq n\}, \{\lambda(u_i; I)\}]}{P[d_n = -1 | \{\lambda(d_k; I): k \neq n\}, \{\lambda(u_i; I)\}]} \quad [11]$$

$$= \log \underbrace{\frac{P[d_n = +1 | \{\lambda(d_k; I)\} \{\lambda(u_i; I)\}]}{P[d_n = -1 | \{\lambda(d_k; I)\} \{\lambda(u_i; I)\}]}}_{=\Lambda(d_n;O)} - \lambda(d_n; I)$$

where $\Lambda(d_n; O)$ is the complete a posteriori probability (APP) of $d_n$, and the equation follows from the definition of conditional probability. LP decoder computes $\Lambda(d_n; O)$, which can then be used (11) to compute $\lambda(d_n; I)$. The computations are similar to the those involved in the soft multiuser detection, with two exceptions: i) the use of linear precoding instead of multiuser spreading codes, and ii) the allowance for non-BPSK as well as BPSK constellations.

The type of EC decoder 44 used depends on the type of EC code used by error-control unit 12. For convolutional codes, the soft information can be obtained by optimum or sub-optimum SISO decoding algorithms, including the BCJR algorithm, the SOVA, Log-MAP, or, max-Log-MAP alternatives. Among them, BCJR and Log-MAP are optimum decoders. The complexity of Log-MAP is lower than that of BCJR, and is approximately 4 times that of Viterbi's algorithm. When a turbo code is used as the EC code, each execution of EC decoder 44 will correspond to a few iterations of LP decoder 40.

Figure 3:
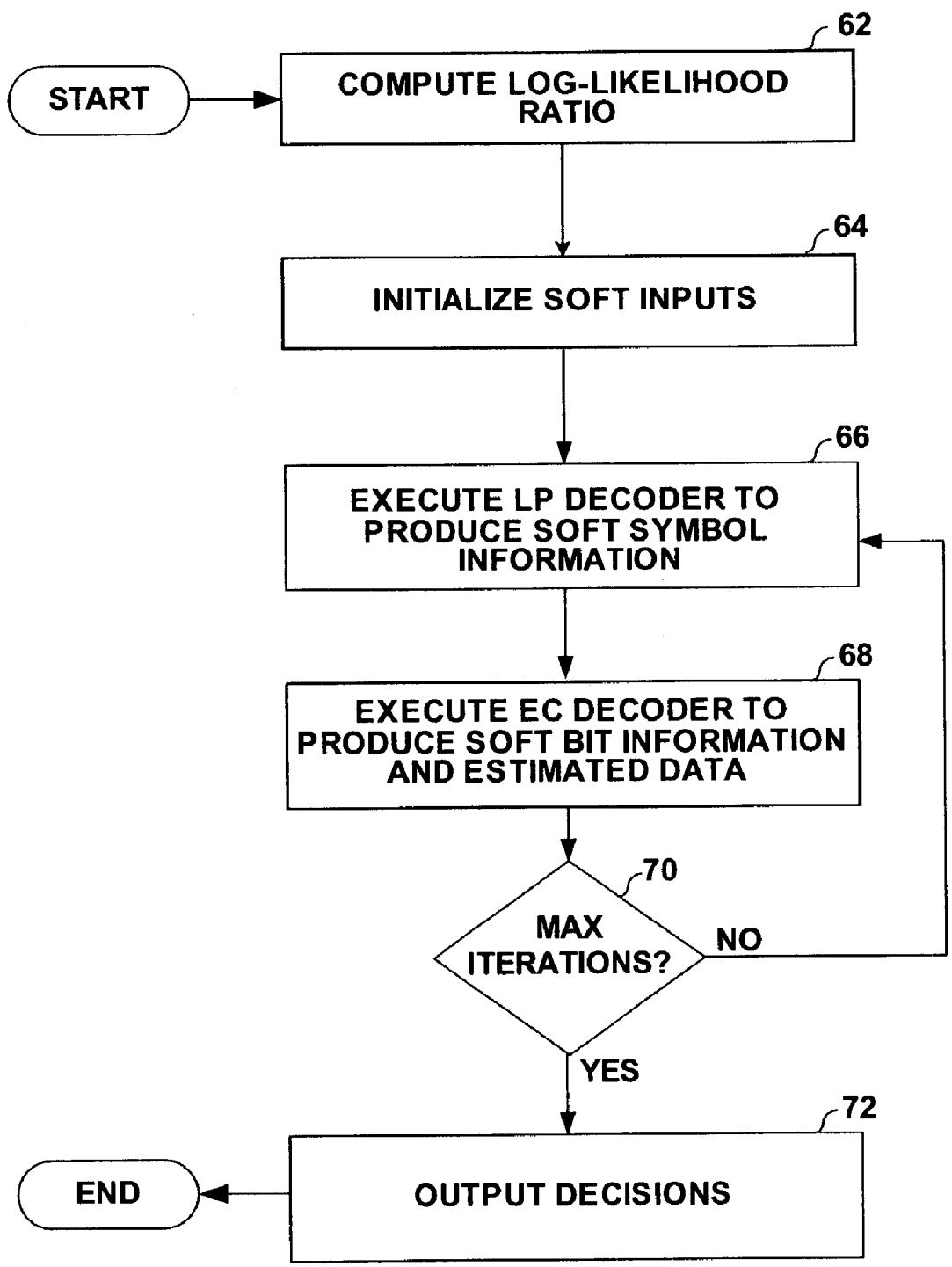
FIG. 3 is a flowchart illustrating exemplary operation of the decoder.

FIG. 3 is a flowchart illustrating exemplary operation of decoder 32. Initially, a log-likelihood ratio (LLR) for symbols y received from de-interleaver 30 is computed (step 62). In particular, from (2), it follows that $P(y_n|u_n)=1/(\pi N_0)\exp(-|y_n-\alpha_n u_n|^2/N_0)$.

Thus, the following can be computed: $P(u_i=u; I):=P(u_i=u|\{y_n\})$ as $$P(u_i = u; I) = [P(u_i = u)/P(y_{iM}, \ldots, y_{iM+M-1})] \quad [12]$$

$$\prod_{m=0}^{M-1} P(y_{iM+m}|u_{iM+m} = [u]_m) =$$

$$C \prod_{m=0}^{M-1} \exp(-|y_{iM+m} - \alpha_{iM+m}[u]_m|^2/N_0),$$

where C is a constant irrelevant to the computation of the LLR's, and a priori probabilities $P(u_i=u)$ are assumed all equal to $1/|U|$ for any $u \in U$. Then, the LLR of $u_i$ can be obtained by definition as $$\lambda(u_i = u; I) = \sum_{m=0}^{M-1} (-|y_{iM+m} - \alpha_{iM+m}[u]_m|^2/N_0) - C',$$

where $C':=\log \lambda(u_i=v; I)$ is a constant that will be canceled out eventually, and can be set to zero for simplicity.

Next, both inputs $\lambda(d_n; I)$ and $\lambda(b_n; I)$ of LP decoder 40 are initialized to zero, $\forall n$ (step 64).

Iteration begins, and LP decoder 40 produces $\{\lambda(d_n; O)\}$ (step 66). In particular, it is known that each coded bit will be mapped to a constellation symbol, say $s_n$, together with other coded bits if the constellation size is larger than 2. The constellation size is denoted by Q. Each constellation symbol will be precoded together with M−1 other symbols to produce one precoded block $u_i$. Let us denote by $I_i$ the set of indices of coded bits $\{d_n\}$ that are precoded to form $u_i$; $I_i$ consists of a sequence of B:=M log$_2$ Q consecutive integers. If BPSK is used, then I=[iM,iM+M−1]. For any l∈ $I_i$, we define $U_i^1$ to be the subset of U that corresponds to $d_l$=1, and similarly $U_i^0$ to be the subset that corresponds to $d_l$=0.

The complete APP $\Lambda(d_l; O)$ for the coded bit $d_l$ can then be computed from $$\lambda(d_l; O) = \log \frac{\sum_{u \in \mathcal{U}_l^1} P(u_i = u; I)\Pi_{l \in I_l}P(d_l; I)}{\sum_{u \in \mathcal{U}_l^0} P(u_i = u; I)\Pi_{l \in I_l}P(d_l; I)}$$

$$= \log \frac{\sum_{u \in \mathcal{U}_l^1} \{\exp[\lambda(u_i = u; I)]\Pi_{l \in I_l}[1 + d_l\tanh(\frac{1}{2}\lambda(d_l; I))]\}}{\sum_{u \in \mathcal{U}_l^0} \{\exp[\lambda(u_i = u; I)]\Pi_{l \in I_l}[1 + d_l\tanh(\frac{1}{2}\lambda(d_l; I))]\}},$$

[13]

where u is the result of constellation mapping and precoding of $\{d_l: l \in I_i\}$, and the definitions in (9) and (10), and the fact that $P(d_l; I)=\frac{1}{2}[1+d_l \tan h(\frac{1}{2}\lambda(d_l; I))]$, is used. Once $\Lambda(d_l; O)$ is obtained, (11) can be used to obtain $\lambda(d_n; O)$ (step 66).

The soft output information from LP decoder 40 is processed by E° C. decoder 44 to produce estimated data 34 (step 68). In particular, steps 66, 68 are repeated until a maximum iterations is reached, e.g., four iterations (step 70), at which final decisions are produced (step 72).

Figure 4:
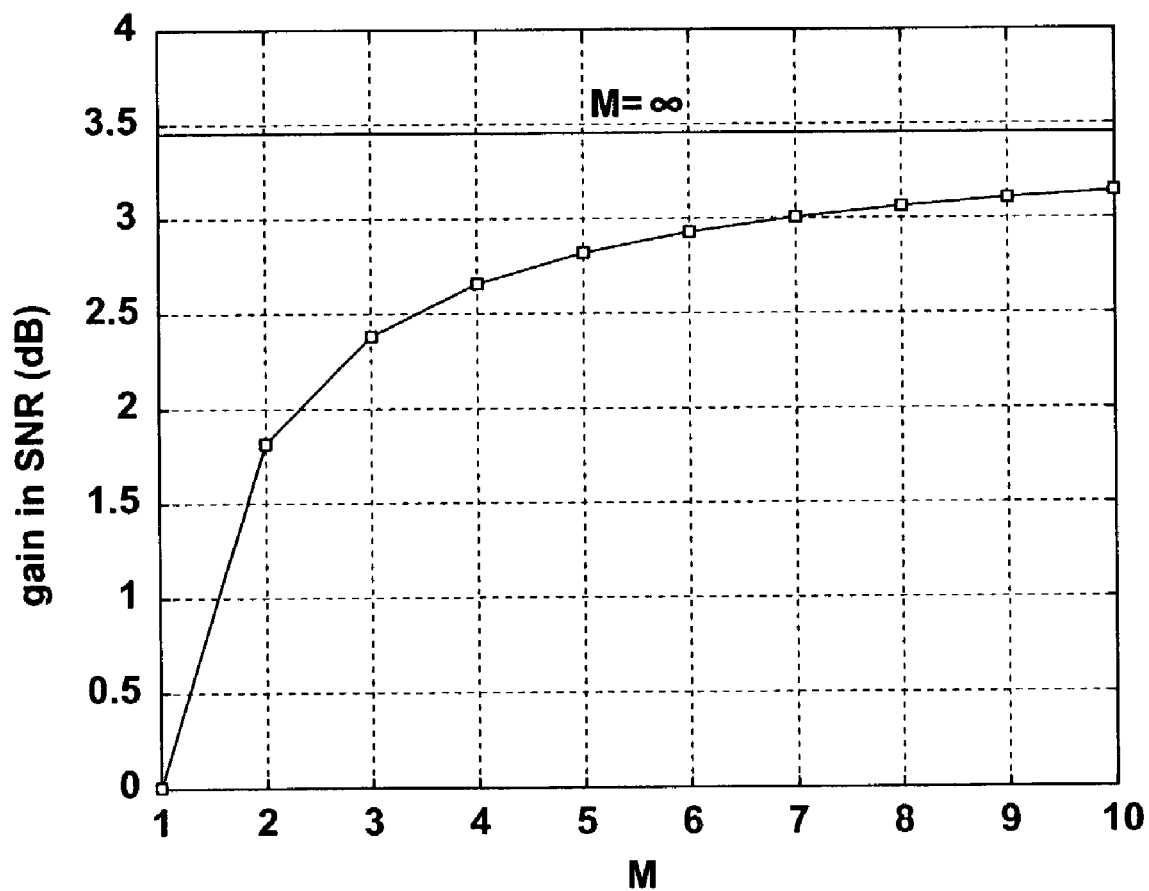
FIG. 4 is a graph that illustrates a gain of unitary precoding as a function of the precoder size.

FIG. 4 is a graph that illustrates a gain of unitary precoding at a signal-to-noise ratio (SNR) of 8 dB as a function of the precoder size M.

Figure 5:
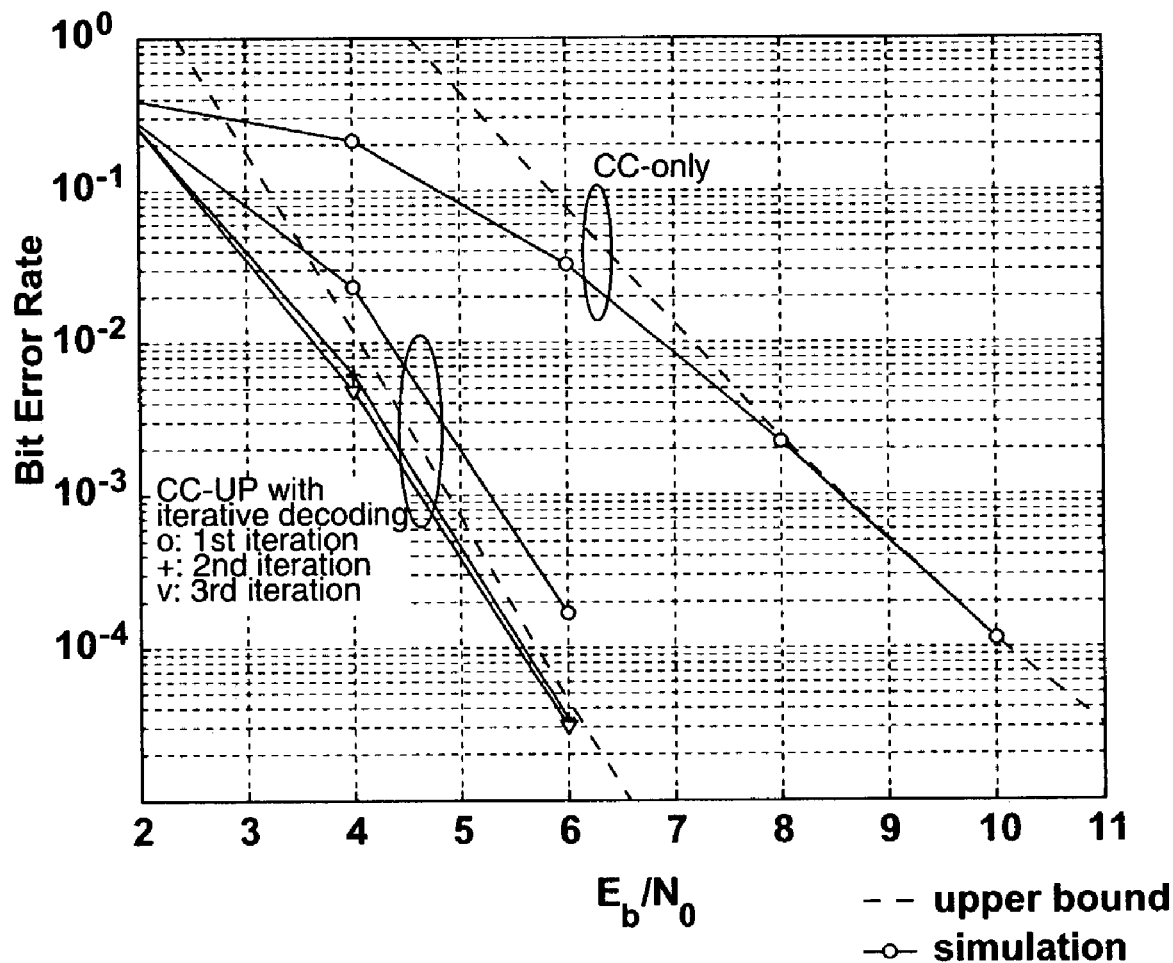
FIGS. 5-7 are graphs that illustrate exemplary results of simulations of the described techniques.
Figure 6:
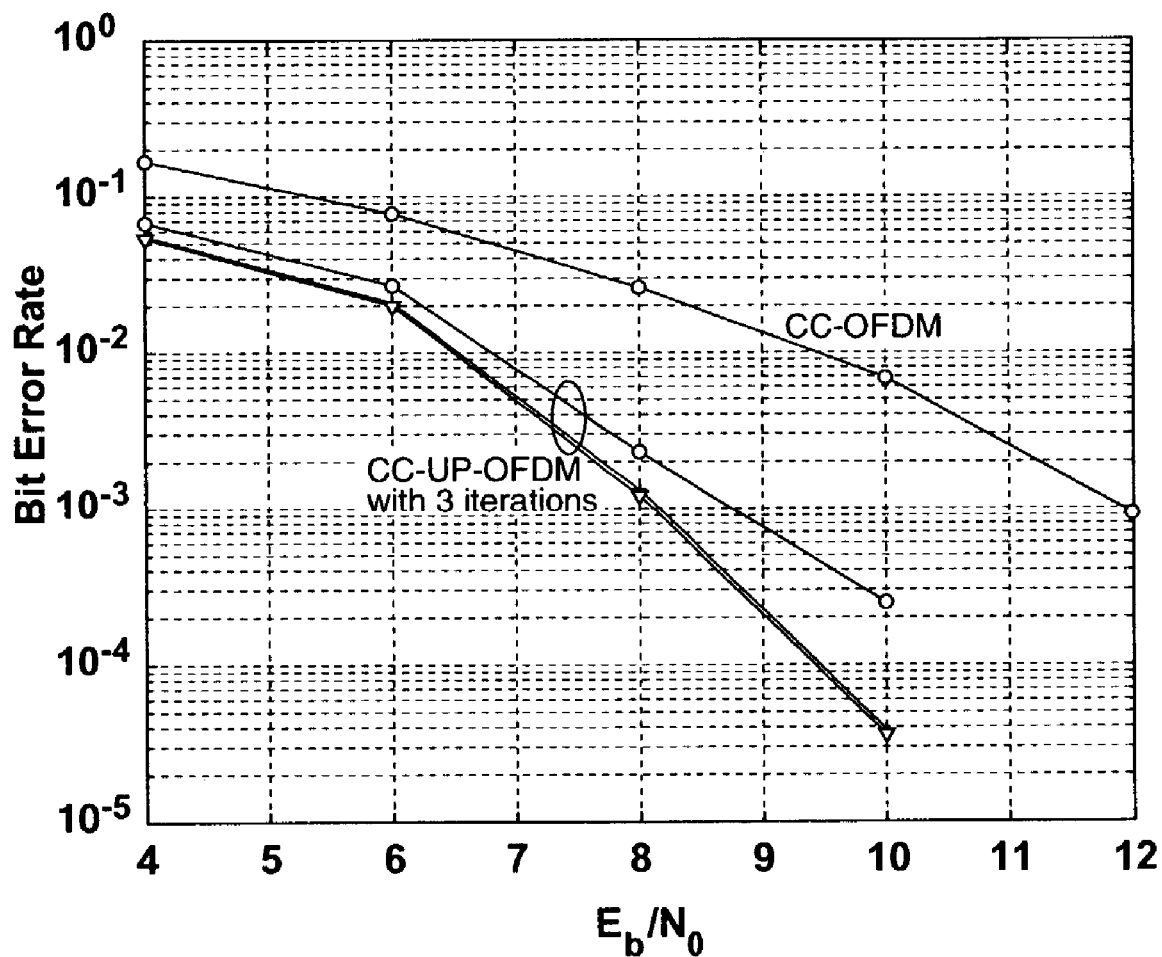
Figure 7:
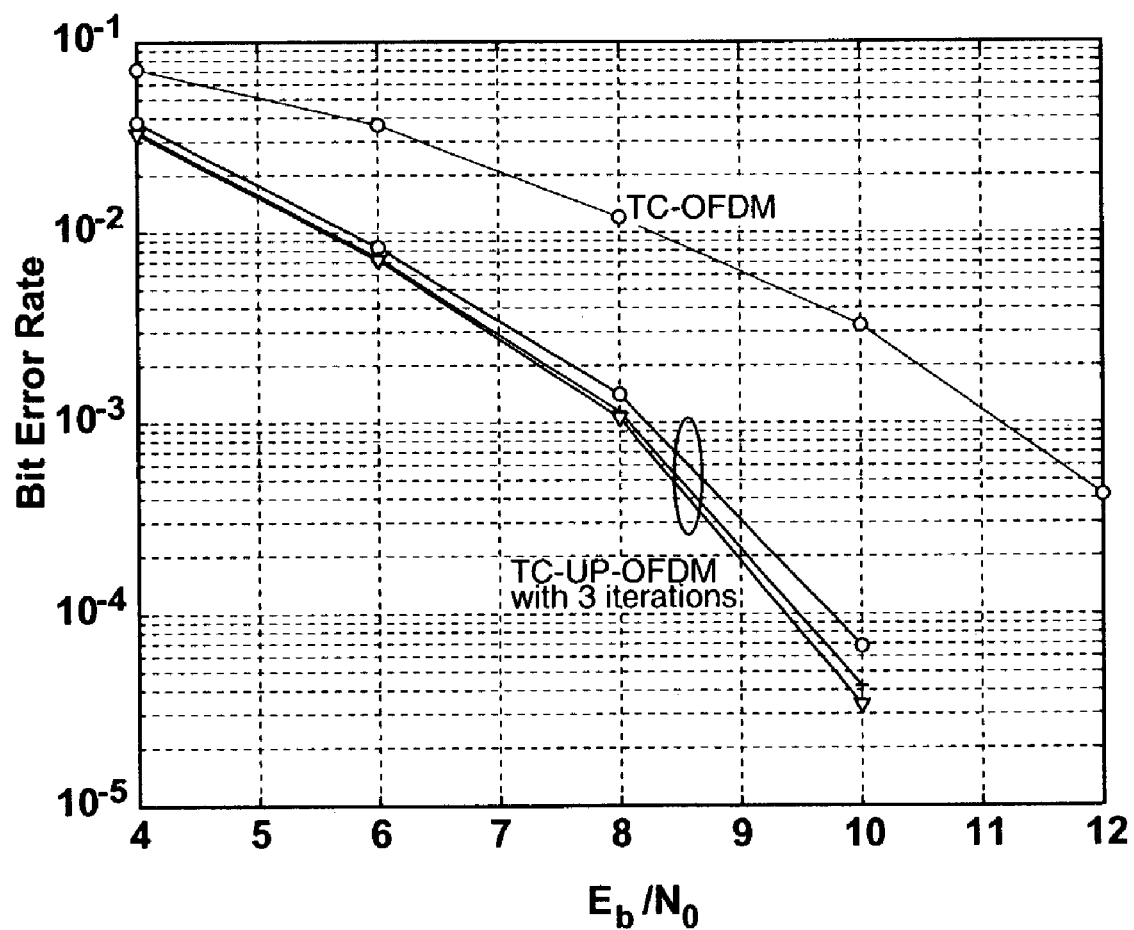

FIGS. 5-7 are graphs that illustrate exemplary results of simulations of the described techniques. In the illustrated results, EC coded transmission with (respectively, without) unitary preceding is denoted by EC-UP (EC-only). When OFDM modulation is used, the terms EC-UP-OFDM and EC-OFDM are used, respectively. When the code is convolutional (respectively, turbo), \EC" is replaced by \CC" (\TC").

In particular, FIG. 5 illustrates the results of the simulations (solid lines) comparing a coded-precoded system (CC-UP) having a precoder size M=4, with a coded (CC-only) system in perfectly interleaved channels, together with the analytical upper bounds (dashed lines). In all simulations, the BPSK constellation is used for simplicity. The simulation was run for each SNR until either 30 frames errors are collected or 1000 frames have been sent, whichever occurs earlier, where a frame has the same size as the larger size of interleavers 14, 20 (FIG. 1).

In this test case the performance of a perfectly interleaved OFDM system was simulated as modeled in (2), which can also be viewed as directly through a flat-fading channel without using OFDM. The CC used is a rate of ¾ code, which is the code used in HiperLan/2. The simulated CC-UP system used the iterative decoding techniques described herein. For CC-only, Viterbi decoding was used.

It can be seen from FIG. 5 that the iterative decoding algorithm described herein virtually converges after only two iterations. And the gain due to linear precoding is significant, about 5 dB at bit error rate (BER)=10. A performance bound is also depicted with dashed lines, and agrees with the simulation results up to less than 1 dB difference at high SNR.

FIG. 6 is a graph that illustrates the simulated performance of a CC-UP-OFDM in a setup mimicking HiperLan/2. In this example, an OFDM symbol size, i.e., the FFT/IFFT size, of 64 was used. The delay of each channel tap was rounded up to the nearest symbol to have 16 symbol-spaced taps. The taps were independent complex Gaussian random variables, with variances given in the tap order by (0:26; 0:244; 0:224; 0:0707; 0:0793; 0:0478; 0:0295; 0:0178; 0:0107; 0:00645; 0:00501; 0:00251; 0; 0:00148; 0; 0:000602). The channel was assumed to remain constant during one OFDM symbol period, and each tap varies from one OFDM symbol to the next according to Jakes' model. The carrier frequency was 5.2 GHz, and the mobile's velocity is 3 m/s.

In this example, interleaver 20 was a block interleaver of size 16×4 so that each precoded block was maximally spread out in the frequency domain. Interleaver 14 was chosen to be a random interleaver of size corresponding to 256 OFDM symbols. The delay of the system due to interleaving was therefore about 1 millisecond in HiperLan/2.

FIG. 6 also depicts the performance of CC-OFDM with a random interleaver of the same size. It can be seen that with either interleaver, CC-UP-OFDM outperformed CC-OFDM, at the price of higher complexity, even with only one iteration. The random interleaver performed better for SNR>6 dB. CC-UP-OFDM with a random interleaver outperformed the standard CC-OFDM by about 4 dB at BER=10 with only 3 iterations. Comparison with the results in Test case 1 illustrates that the channel correlation indeed lowers the system performance, as expected.

FIG. 7 is a graph that illustrates the results of a simulation in which the CC of the previous simulation was replaced by a turbo code (TC), while maintaining the same simulation setup. The main purpose of this simulation was to demonstrate that even turbo coded OFDM transmissions can benefit from linear preceding. The simulations compared TC-UP-OFDM and TC-OFDM using the turbo code with constituent code [1 35/23], punctured to rate ¾ by keeping the systematic bits and every (6n−1)st parity bit from the first constituent code, and every (6n)th parity bit from the second constituent code, n=1; 2; : : :.

Each iteration consisted of one iteration between the LP decoder 40 and EC decoder 44 (FIG. 2); within EC decoder 44 inner-iterations are used for the turbo code decoding. Although TC-OFDM benefits from iterative decoding, there is about 4 dB gain at $10^{-3}$ achieved by the linear preceding after 3 iterations. For the simulated setup, one iteration between LP decoder 40 and EC decoder 44 was enough.

Various embodiments of the invention have been described. The described techniques can be embodied in a variety of receivers and transmitters including base stations, cell phones, laptop computers, handheld computing devices, personal digital assistants (PDA's), and the like. The devices may include a digital signal processor (DSP), field programmable gate array (FPGA), application specific integrated circuit (ASIC) or similar hardware, firmware and/or software for implementing the techniques. If implemented in software, a computer readable medium may store computer readable instructions, i.e., program code, that can be executed by a processor or DSP to carry out one of more of the techniques described above. For example, the computer readable medium may comprise random access memory (RAM), read-only memory (ROM), non-volatile random access memory (NVRAM), electrically erasable programmable read-only memory (EEPROM), flash memory, or the like. The computer readable medium may comprise computer readable instructions that when executed in a wireless communication device, cause the wireless communication device to carry out one or more of the techniques described herein. These and other embodiments are within the scope of the following claims.

The invention claimed is:

1. A wireless communication device comprising:
an error-control coder that applies an error correction code to produce an encoded data stream of information bearing symbols;
a bit interleaver to produce an interleaved data stream in which neighboring data bits of the encoded data stream are positioned to be mapped to different constellation symbols;
a mapping unit to map the interleaved data stream to the constellation symbols, wherein the constellation symbols are selected from a constellation having a finite alphabet;
a precoder that applies a liner transformation to the constellation symbols to produce precoded symbols, wherein the precoded symbols are complex numbers that are not restricted to the finite alphabet of the constellation;
a symbol interleaver to process the precoded symbols to produce permuted blocks of the precoded symbols; and
a modulator to produce an output waveform in accordance with the permuted blocks of precoded symbols for transmission through a wireless channel.

2. The wireless communication device of claim 1,
wherein the precoder forms blocks of M information bearing symbols from successive information bearing symbols of the encoded data steam, and
wherein the precoder linearly precodes the blocks of information bearing symbols by applying a unitary matrix of size M×M produce corresponding linearly precoded blocks of information bearing symbols.

3. The wireless communication device of claim 1, wherein the error-control coder comprises a convolutional coder.

4. The wireless communication device of claim 1, wherein the error-control coder comprises a turbo coder.

5. The wireless communication device of claim 1, wherein the output waveform has a diversity gain that is a multiplicative function of a free distance D of the error-control coder and a symbol block size M of the linear precoder, where M is a nonzero integer.

6. The wireless communication device of claim 1, wherein the linear precoder applies a unitary matrix to blocks of M symbols of the encoded data stream, where M is a nonzero integer.

7. The wireless communication device of claim 1, wherein the wireless communication device comprises one of a base station and a mobile device.

8. A wireless communication device comprising:
a demodulator that receives a waveform carrying a joint coded-linearly precoded transmission over a wireless channel and produces a demodulated data stream, wherein the joint coded-linearly precoded transmission was produced by applying an error correction code to generate an encoded data stream of information bearing symbols, mapping the information bearing symbols to constellation symbols of a constellation, and linearly precoding the information symbols by applying a linear transformation to the constellation symbols to produce precoded symbols aver a complex field without restriction to an alphabet size of the constellation;
a de-interleaver that reassembles blocks of linearly precoded symbols from the demodulated data stream; and
a decoder that applies iterative decoding techniques to decode the blocks of linearly precoded symbols and produce estimated data.

9. The wireless communication device of claim 8, wherein the decoder iteratively applies a maximum a posteriori (MAP) decoding scheme to produce the estimated data.

10. The wireless communication device of claim 8, wherein the wireless communication device comprises one of a base station and a mobile device.

11. The wireless communication device of claim 8, wherein the decoder comprises:
a symbol decoder that applies maximum a posteriori (MAP) decoding to blocks of symbols within the demodulated data stream to produce soft symbol information; and a bit decoder that receives the soft symbol information and applies MAP decoding to produce soft bit information and the estimated data, wherein the soft bit information is fed back to the symbol decoder for computation of the soft symbol information.

12. The wireless communication device of claim 11, wherein the symbol decoder and the bit decoder iteratively produce the soft symbol information and the soft bit information to compute the estimated data.

13. A system comprising:
a transmitter that includes:
an error-control coder that applies an error correction code to produce an encoded data stream of information-bearing symbols;
a bit interleaver to produce an interleaved data stream in which neighboring data bits of the encoded data stream are positioned to be mapped to different constellation symbols selected from a constellation having a finite alphabet;
a mapping unit to map the neighboring data bits of the encoded data stream to the different constellation symbols;
a precoder that linearly precodes the constellation symbols over a complex field without restriction to an alphabet size of the constellation to produce a joint coded-precoded data stream;
a symbol interleaver to process the precoded data stream to produce permuted blocks of precoded symbols;
a modulator to output a waveform from the permuted blocks of precoded symbols; and
a receiver that receives the waveform from the transmitter via a wireless communication channel, and demodulates the waveform to produce estimated data.

14. The system of claim 13,
wherein the precoder forms blocks of M information bearing symbols from successive information bearing symbols of the encoded data stream, and
wherein the precoder linearly precodes the blocks of information bearing symbols by applying a unitary matrix of size M×M to produce corresponding linearly precoded blocks of information bearing symbols.

15. The system of claim 13, wherein the error-control coder comprises a convolutional coder.

16. The system of claim 13, wherein the error-control coder comprises a turbo coder.

17. The system of claim 13, wherein the waveform has a diversity gain that is a multiplicative function of a free distance of the error-control coder and a symbol block size of the linear precoder.

18. The system of claim 13, wherein the linear precoder comprises a unitary matrix.

19. The system of claim 13, wherein the transmitter comprises a base station and the receiver comprises a mobile wireless communication device.

20. The system of claim 13, wherein the transmitter comprises a mobile wireless communication device and the receiver comprises a base station.

21. A method comprising:
encoding a data stream with an error-control code to produce an encoded data stream of information bearing symbols;
bit interleaving the encoded data stream to produce an interleaved data stream in which neighboring data bits of the encoded data stream are positioned to be mapped to different constellation symbols of a constellation having a finite alphabet;
mapping the encoded data stream to the constellation symbols;
linearly precoding the constellation symbols by applying a linear transformation to produce precoded symbols, wherein the preceded symbols are not restricted to the finite alphabet of the constellation;
processing the preceded symbols to produce permuted blocks of the preceded symbols;
modulating the permuted blocks of preceded symbols to produce an output waveform; and
transmitting the output waveform through a wireless channel.

22. The method of claim 21, wherein the error-control code comprises a convolutional code or a turbo code.

23. A method comprising:
demodulating a waveform received over a wireless channel to produce a demodulated data stream, wherein the waveform was transmitted by applying an error connection code to generate an encoded data stream of information bearing symbols, bit interleaving the encoded information bearing symbols, mapping the information bearing symbols to constellation symbols of a constellation, linearly precoding the information bearing symbols by application of a linear transformation to the constellation symbols without restriction to an alphabet size of the constellation, and block interleaving the precoded information bearing symbols for transmission;
de-interleaving the demodulated data stream by reassembling blocks of linearly precoded symbols from the demodulated data; and
iteratively decoding the demodulated data stream to produce estimated data.

24. The method of claim 23, wherein iteratively decoding comprises iteratively applying a maximum a posteriori (MAP) decoding scheme to produce the estimated data.

25. The method of claim 24, wherein iteratively applying a maximum a posteriori (MAP) decoding scheme comprises:
applying MAP decoding to blocks of symbols within the demodulated data stream to compute soft symbol information;
applying MAP decoding to the soft symbol information to compute soft bit information; and
outputting the estimated data based on the soft bit information.

26. The method of claim 24, wherein iteratively applying a maximum a posteriori (MAP) decoding scheme further comprises applying the MAP decoding to the blocks of symbols as a function of feedback information that includes at least a portion of the computed soft bit information.

27. A computer-readable medium comprising instructions to cause a programmable processor to:
encode a data stream with an error correction code to produce an encoded data stream of information bearing symbols;
interleave the encoded data stream to produce an interleaved data stream in which the information bearing symbols are permuted;
map the encoded data stream to constellation symbols;
linearly precode the information bearing symbols of the encoded data stream by applying a linear transformation to the constellation symbols to produce a precoded data stream of preceded symbols, wherein the precoded symbols are complex numbers that are not restricted to the finite alphabet of the constellation;

process the precoded data stream to produce an interleaved data stream in which blocks of the preceded symbols are permuted;

modulate the interleaved precoded data stream to produce an output waveform; and transmit the output waveform through a wireless channel.

28. A computer-readable medium comprising instructions to cause a programmable processor to:

demodulate a waveform received over a wireless channel to produce a demodulated data stream, wherein the waveform was transmitted by applying an error correction code to generate an encoded data stream of information bearing symbols, bit interleaving the encoded information bearing symbols, mapping the information bearing symbols to constellation symbols of a constellation, linearly precoding the information bearing symbols by application of a linear transformation to the constellation symbols without restriction to an alphabet size of the constellation, and block interleaving the preceded information bearing symbols for transmission;

de-interleaving the demodulated data stream by reassembling blocks of linearly precoded symbols from the demodulated data;

apply MAP decoding to the reassembled blocks of symbols within the demodulated data stream to compute soft symbol information;

apply MAP decoding to the soft symbol information to compute soft bit information; and output estimated data based on the soft bit information.

29. The method of claim 21, wherein linearly precoding the constellation symbols comprises:

forming blocks of information beading symbols from successive ones of the information bearing symbols of the encoded data stream; and linearly precoding complex fields of the information bearing symbols on a block-by-block basis to produce corresponding linearly precoded blocks of information bearing symbols.

* * * * *

UNITED STATES PATENT AND TRADEMARK OFFICE
CERTIFICATE OF CORRECTION

PATENT NO.        : 7,251,768 B2
APPLICATION NO.   : 10/420361
DATED             : July 31, 2007
INVENTOR(S)       : Georgios B. Giannakis et al.

It is certified that error appears in the above-identified patent and that said Letters Patent is hereby corrected as shown below:

Specification,

Summary, Column 2, Line 35: says "system without preceding", should say -- system without precoding --

Detailed Description, Equation 1, Column 5, Line 30: says
" $\bar{y}_{(k-1)N+l} = H(l/N)\bar{u}_{(k-1)N+l} + \bar{\eta}_{(k-1)N+l}, l \in [0, N-1], k=0, 1$ ", should say
-- $\bar{y}_{(k-1)N+l} = H(l/N)\bar{u}_{(k-1)N+l} + \bar{\eta}_{(k-1)N+l}, l \in [0, N-1], k = 0, 1, \ldots,$ --

Detailed Description, Column 6, Line 48: says "unitary preceding", should say -- unitary precoding --

Detailed Description, Column 6, Line 54: says "linear preceding", should say -- linear precoding --

Detailed Description, Column 6, Line 62: says "call approach", should say -- can approach --

Detailed Description, Column 6, Line 66: says "AWGN cone", should say -- AWGN one --

Detailed Description, Column 7, Line 2: says "linear preceding", should say -- linear precoding --

Signed and Sealed this
Thirty-first Day of May, 2016

Michelle K. Lee
*Director of the United States Patent and Trademark Office*

CERTIFICATE OF CORRECTION (continued)
U.S. Pat. No. 7,251,768 B2

Page 2 of 3

Detailed Description, Equation 6, Column 7, Line 18: says

"$$\Theta_4 = \frac{1}{\sqrt{2}} \begin{vmatrix} 1 & e^{j\frac{\pi}{8}} & e^{j\frac{2\pi}{8}} & e^{j\frac{3\pi}{8}} \\ 1 & e^{j\frac{5\pi}{8}} & e^{j\frac{10\pi}{8}} & e^{j\frac{15\pi}{8}} \\ 1 & e^{j\frac{9\pi}{8}} & e^{j\frac{18\pi}{8}} & e^{j\frac{27\pi}{8}} \\ 1 & e^{j\frac{13\pi}{8}} & e^{j\frac{26\pi}{8}} & e^{j\frac{39\pi}{8}} \end{vmatrix}$$", should say $$\Theta_4 = \frac{1}{2} \begin{bmatrix} 1 & e^{j\frac{\pi}{8}} & e^{j\frac{2\pi}{8}} & e^{j\frac{3\pi}{8}} \\ 1 & e^{j\frac{5\pi}{8}} & e^{j\frac{10\pi}{8}} & e^{j\frac{15\pi}{8}} \\ 1 & e^{j\frac{9\pi}{8}} & e^{j\frac{18\pi}{8}} & e^{j\frac{27\pi}{8}} \\ 1 & e^{j\frac{13\pi}{8}} & e^{j\frac{26\pi}{8}} & e^{j\frac{39\pi}{8}} \end{bmatrix} .$$

--

Detailed Description, Equation 11, Column 8, Line 42: says

"$$\lambda(d_n; O) = \log \frac{P[d_n = +1 | \{\lambda(d_k; I) : k \neq n\}, \{\lambda(u_i; I)\}]}{P[d_n = -1 | \{\lambda(d_k; I) : k \neq n\}, \{\lambda(u_i; I)\}]}$$

$$= \underbrace{\log \frac{P[d_n = +1 | \{\lambda(d_k; I)\}\{\lambda(u_i; I)\}]}{P[d_n = -1 | \{\lambda(d_k; I)\}\{\lambda(u_i; I)\}]}}_{=\Lambda(d_n; O)} - \lambda(d_n; I)$$", should say $$\lambda(d_n; O) = \log \frac{P[d_n = +1 | \{\lambda(d_k; I) : k \neq n\}, \{\lambda(\mathbf{u}_i; I)\}]}{P[d_n = -1 | \{\lambda(d_k; I) : k \neq n\}, \{\lambda(\mathbf{u}_i; I)\}]}$$

$$= \underbrace{\log \frac{P[d_n = +1 | \{\lambda(d_k; I)\}, \{\lambda(\mathbf{u}_i; I)\}]}{P[d_n = -1 | \{\lambda(d_k; I)\}, \{\lambda(\mathbf{u}_i; I)\}]}}_{= \Lambda(d_n; O)} - \lambda(d_n; I)$$

--

Detailed Description, Equation 13, Column 9, Line 48: says

"$$\lambda(d_l; O) = \log \frac{\sum_{u=\mathcal{U}_l^1} P(u_i = u; I) \Pi_{l=J_l} P(d_l; I)}{\sum_{u=\mathcal{U}_l^0} P(u_i = u; I) \Pi_{l=J_l} P(d_l; I)}$$

$$= \log \frac{\sum_{u=\mathcal{U}_l^1} \{\exp[\lambda(u_i = u; I)] \Pi_{l=J_l} [1 + d_l \tanh(\frac{1}{2}\lambda(d_l; I))]\}}{\sum_{u=\mathcal{U}_l^0} \{\exp[\lambda(u_i = u; I)] \Pi_{l=J_l} [1 + d_l \tanh(\frac{1}{2}\lambda(d_l; I))]\}}$$", should say $$\Lambda(d_i; O) = \log \frac{\sum_{u \in \mathcal{U}_i^1} P(u_i = u; I) \prod_{l \in \mathcal{I}_i} P(d_l; I)}{\sum_{u \in \mathcal{U}_i^0} P(u_i = u; I) \prod_{l \in \mathcal{I}_i} P(d_l; I)}$$

$$= \log \frac{\sum_{u \in \mathcal{U}_i^1} \{\exp[\lambda(u_i = u; I)] \prod_{l \in \mathcal{I}_i} [1 + d_l \tanh(\frac{1}{2}\lambda(d_l; I))]\}}{\sum_{u \in \mathcal{U}_i^0} \{\exp[\lambda(u_i = u; I)] \prod_{l \in \mathcal{I}_i} [1 + d_l \tanh(\frac{1}{2}\lambda(d_l; I))]\}},$$

Detailed Description, Column 9, Line 66: says "E° C", should say -- EC --

Detailed Description, Column 10, Line 9: says "unitary preceding", should say -- unitary precoding --

Detailed Description, Column 11, Line 19: says "linear preceding", should say -- linear precoding --

Detailed Description, Column 11, Line 29: says "linear preceding", should say -- linear precoding --

Claims,

Claim 2; Column 12, Line 17: says "MxM produce" should say -- MxM to produce --

Claim 8; Column 12, Line 48: says "aver a complex field" should say -- over a complex field --

Claim 21; Column 14, Line 7: says "preceded symbols" should say -- precoded symbols --

Claim 21; Column 14, Line 8: says "preceded symbols" should say -- precoded symbols --

Claim 21; Column 14, Line 9: says "preceded symbols" should say -- precoded symbols --

Claim 23; Column 14, Line 19: says "connection" should say -- correction --

Claim 27; Column 14, Line 65: says "preceded symbols" should say -- precoded symbols --

Claim 27; Column 15, Line 2: says "preceded symbols" should say -- precoded symbols --

Claim 28; Column 15, Line 20: says "preceded information" should say -- precoded information --